United States Patent
Tseng

[19]

[11] Patent Number: 5,889,301
[45] Date of Patent: Mar. 30, 1999

[54] SEMICONDUCTOR MEMORY DEVICE HAVING AN E-SHAPED STORAGE NODE

[75] Inventor: Horng-Huei Tseng, Hsinchu, Taiwan

[73] Assignee: Vanguard International Semiconductor Corporation, Hsin-Chu, Taiwan

[21] Appl. No.: 725,807

[22] Filed: Oct. 4, 1996

Related U.S. Application Data

[62] Division of Ser. No. 661,245, Jun. 10, 1996, Pat. No. 5,604,146.

[51] Int. Cl.$^6$ .................................................. H01L 29/00
[52] U.S. Cl. ........................ 257/308; 257/296; 257/302; 257/306
[58] Field of Search .................................. 257/296, 309, 257/302, 306, 308

[56] References Cited

U.S. PATENT DOCUMENTS

| | | | |
|---|---|---|---|
| 5,126,280 | 6/1992 | Chan et al. | 257/309 |
| 5,150,276 | 9/1992 | Gonzalez et al. | 257/296 |
| 5,158,905 | 10/1992 | Ahn | 257/309 |
| 5,164,881 | 11/1992 | Ahn | 257/309 |
| 5,223,729 | 6/1993 | Kudoh et al. | 257/296 |
| 5,274,258 | 12/1993 | Ahn | 257/309 |
| 5,285,092 | 2/1994 | Yoneda | 257/296 |
| 5,338,700 | 8/1994 | Dennison et al. | 257/296 |
| 5,364,809 | 11/1994 | Kwon et al. | 437/52 |
| 5,389,568 | 2/1995 | Yun | 437/60 |
| 5,438,013 | 8/1995 | Kim et al. | 437/60 |
| 5,453,633 | 9/1995 | Yun | 257/306 |
| 5,512,768 | 4/1996 | Lur et al. | 257/309 |
| 5,572,053 | 11/1996 | Ema | 257/296 |
| 5,714,779 | 2/1998 | Auer et al. | 257/306 |

OTHER PUBLICATIONS

IBM Technical Disclosure Bulletin, vol. 33, No. 2, pp. 245–247, Jul. 1990.

*Primary Examiner*—Valencia Martin-Wallace
*Attorney, Agent, or Firm*—George O. Saile; Stephen B. Ackerman; Rosemary L.S. Pike

[57] ABSTRACT

A dynamic random access memory having a high capacitance capacitor is described. Field oxide areas on the surface of a semiconductor substrate surround device areas including field effect devices, gate dielectric and gate electrode structures on the substrate in the device areas. Source/drain structures associated with the gate electrode structures lie within the device areas of the semiconductor substrate. An insulating layer covers the device areas. A capacitor structure comprises a bottom electrode formed by the central cylindrical portion of a polysilicon layer which electrically contacts the source/drain structures through an opening in the insulating layer, a storage node overlying the insulating layer, the storage node having an E-shape with three prongs wherein the prongs point upward from the central cylindrical portion of the polysilicon layer, a capacitor dielectric layer overlying all surfaces of the storage node, and a top plate electrode layer overlying the capacitor dielectric layer on all surfaces of the storage node to complete the capacitor.

6 Claims, 7 Drawing Sheets

SEMICONDUCTOR MEMORY DEVICE HAVING AN E-SHAPED STORAGE NODE

This is a divisional of application Ser. No. 08/661,245, filed on Jun. 10, 1996, now U.S. Pat. No. 5,604,146 issued on Feb. 18, 1997.

BACKGROUND OF THE INVENTION (1) Field of the Invention

The present invention relates to a method of fabricating a dynamic random access memory having an increased capacitance capacitor having an E-shaped storage node.

(2) Description of the Prior Art

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lowering of source/drain ratio and undesirable signal problems. In order to achieve the desired higher level of integration, the technology must keep almost the same storage capacitance on a greatly reduced cell area.

Efforts to maintain or increase the storage capacitance in memory cells with greater packing densities have included the use of a stacked cylindrical capacitor design in which the capacitor cell uses the space over the device area for the capacitor plates. In U.S. Pat. No. 5,389,568 to Yun, the inventor describes a method of forming a cylindrical capacitor with a central pillar including a hole. U.S. Pat. No. 5,438,013 to Kim et al teaches a method of forming a double cylindrical capacitor. U.S. Pat. No. 5,364,809 to Kwon et al teaches a method of fabricating a multi-chamber type capacitor.

SUMMARY OF THE INVENTION

Accordingly, it is a primary object of the invention to provide an improved and very manufacturable process for producing a memory cell capacitor with increased capacitance.

A method is described for forming a dynamic random access memory cell with an increased capacitance capacitor. Relatively thick field oxide areas are formed on the surface of a semiconductor substrate while leaving device areas for fabrication of semiconductor devices. Device structures are formed within the device areas of the semiconductor substrate wherein the device structures include a capacitor node contact region within the silicon substrate. The capacitors are formed by the following steps. A dielectric layer is deposited overlying the semiconductor device structures. An insulating layer is deposited overlying the dielectric layer and is planarized. A contact is opened through the insulating layer and the dielectric layer to the capacitor node contact region. A first layer of polysilicon is deposited overlying the insulating layer and filling the contact opening wherein the portion of the first polysilicon layer contacting the node contact region forms the bottom electrode of the capacitor. A portion of the first polysilicon layer is etched away wherein a well opening is formed above the contact opening. A layer of silicon oxide is deposited overlying the first polysilicon layer and conformally within the well opening. The silicon oxide layer is etched back to leave spacers on the sidewalls of the well opening. A second layer of polysilicon is deposited overlying the first polysilicon layer and within the well opening. The second polysilicon layer is removed except where the second polysilicon layer forms a plug within the well opening. The spacers on the walls of the well opening are removed wherein gaps are left on either side of the plug. The first polysilicon layer is patterned so that an E-shaped structure having three prongs is formed wherein the prongs of the E-shaped structure point upward and wherein the plug forms the central prong and wherein the outer two prongs are formed by the patterned first polysilicon layer and wherein the E-shaped structure forms the storage node of the capacitor. A capacitor dielectric layer is deposited over all surfaces of the substrate wherein the capacitor dielectric layer covers the surfaces of the E-shaped structure. A third polysilicon layer is deposited overlying the capacitor dielectric layer wherein the third polysilicon layer covers and fills the gaps of the E-shaped structure and wherein the third polysilicon layer forms the top electrode of the capacitor to complete formation of the DRAM with capacitor.

According to another aspect of the present invention, a dynamic random access memory having a high capacitance capacitor is described. Field oxide areas on the surface of a semiconductor substrate surround device areas for fabrication of field effect devices, gate dielectric and electrode structures on the substrate in the device areas. Source/drain structures associated with the gate structures lie within the device areas of the semiconductor substrate. A capacitor structure comprises a bottom electrode formed by the central cylindrical portion of a polysilicon layer which electrically contacts the source/drain structures, a storage node having an E-shape with three prongs wherein the prongs point upward from the central cylindrical portion of the polysilicon layer, a capacitor dielectric layer overlying all surfaces of the storage node, and a top plate electrode layer overlying the capacitor dielectric layer on all surfaces of the storage node to complete the capacitor.

BRIEF DESCRIPTION OF THE DRAWINGS

In the following drawings forming a material part of this description, there is shown:

FIGS. 1 through 12 are schematic cross-sectional representations of a preferred embodiment of the present invention.

DESCRIPTION OF THE PREFERRED EMBODIMENTS

Figure 1:
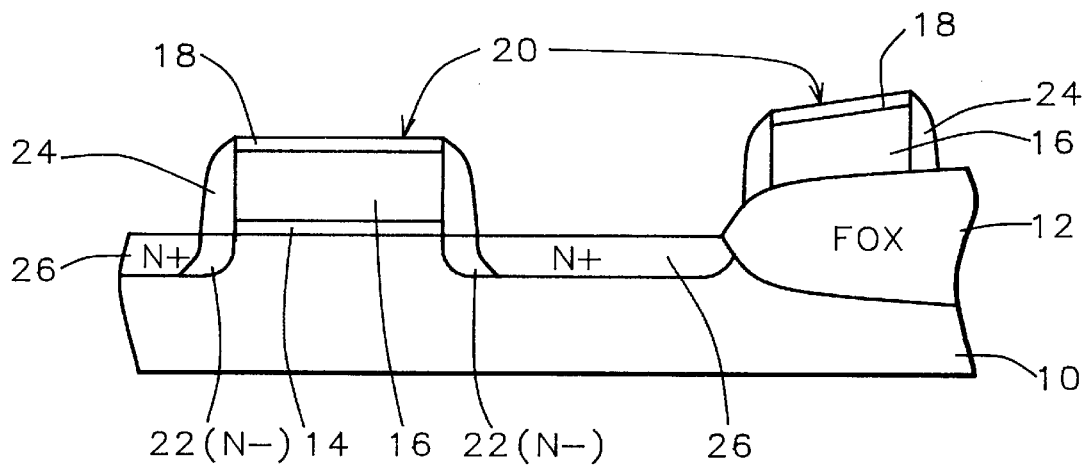

Referring now more particularly to FIG. 1, the first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. Field oxide regions 12 are formed in and on the semiconductor substrate.

The surface of the silicon substrate 10 is thermally oxidized to form the desired gate oxide 14 thickness. The preferred thickness is between about 80 to 200 Angstroms. The polysilicon layer 16 is blanket deposited by low pressure chemical vapor deposition (LPCVD) to a preferred thickness of between about 1500 to 3500 Angstroms. A layer 18 of silicon oxide is chemically vapor deposited over the surface of the polysilicon to a thickness of between about 600 to 1200 Angstroms. The layers 14, 16, and 18 are patterned by lithography and anisotropic etching techniques as are conventional in the art to provide a desired pattern of gate electrodes and word lines 20 as seen in FIG. 1.

The source/drain structure of the MOS FET may now be formed by the following steps. FIGS. 1 through 12 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

FIG. 1, for example shows the ion implantations of N-dopants. Lithographic masks may be required to protect the areas not to be subjected to that particular N- ion implantation. The formation of the lithographic masks is done by conventional lithography and etching techniques. The N-lightly doped drain implantation 22 is done with, for example, $P_{31}$ at a dosage of between about 1 E 13 to 1 E 14 atoms/cm$^2$ and an energy of between about 20 to 40 Kev.

The dielectric spacer 24 is now to be formed followed by the completion of the lightly doped drain source/drain structures. A tetraethyloxysilane (TEOS) LPCVD deposition is preferred to a thickness of between about 1000 to 2000 Angstroms.

An anisotropic etching of this layer produces the dielectric spacer layer 24 on the sidewalls of the layer structures 20.

The heavily doped source and drain regions 26 are formed by implantation with, for example, arsenic at a dosage of between about 1 E 15 to 1 E 16 atoms/cm$^2$ and an energy of between about 20 to 80 Kev.

Figure 2:
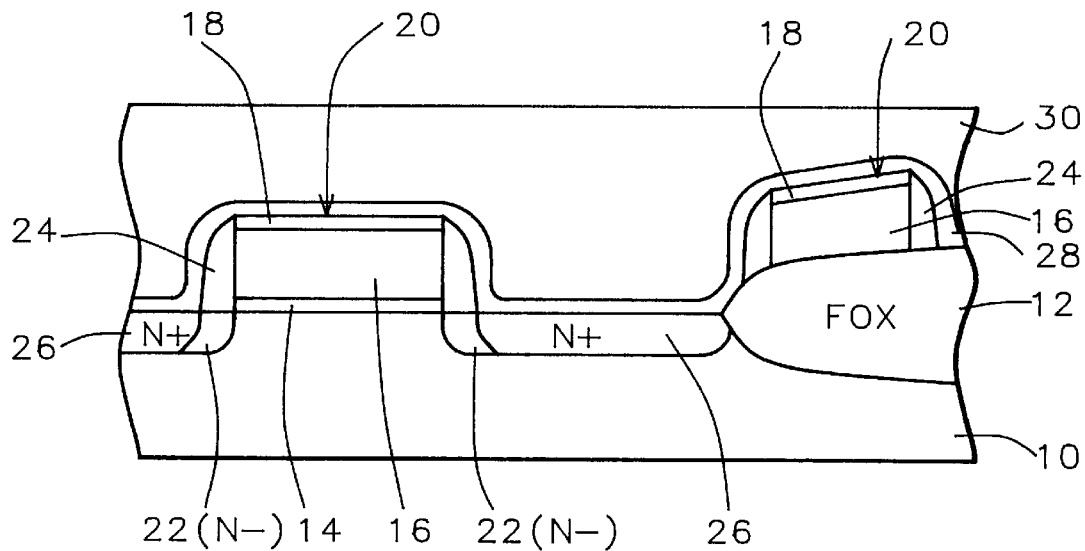

Referring now to FIG. 2, a layer of silicon oxide or nitride 28 is formed over the field oxide and device areas to a thickness of between about 800 to 2000 Angstroms. Next, a thick insulating layer, such as chemically vapor deposited (CVD) oxide or borophosphosilicate glass (BPSG) 30 is deposited to a thickness of between about 5000 to 10,000 Angstroms and then planarized, for example by chemical mechanical polishing (CMP), to obtain a flat surface.

Figure 3:
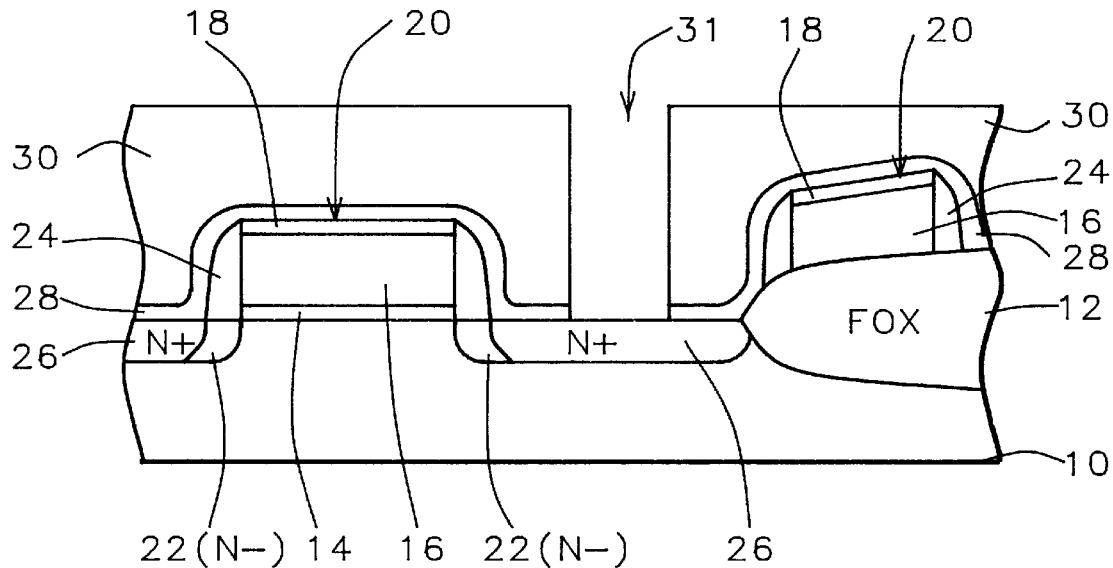

Referring now to FIG. 3, using conventional lithographic and etching techniques, contact openings are made through the CVD oxide or BPSG layer 30 and silicon nitride layer 28 to the silicon substrate. Opening 31 is made to the node contact region for the capacitor structure.

Figure 4:
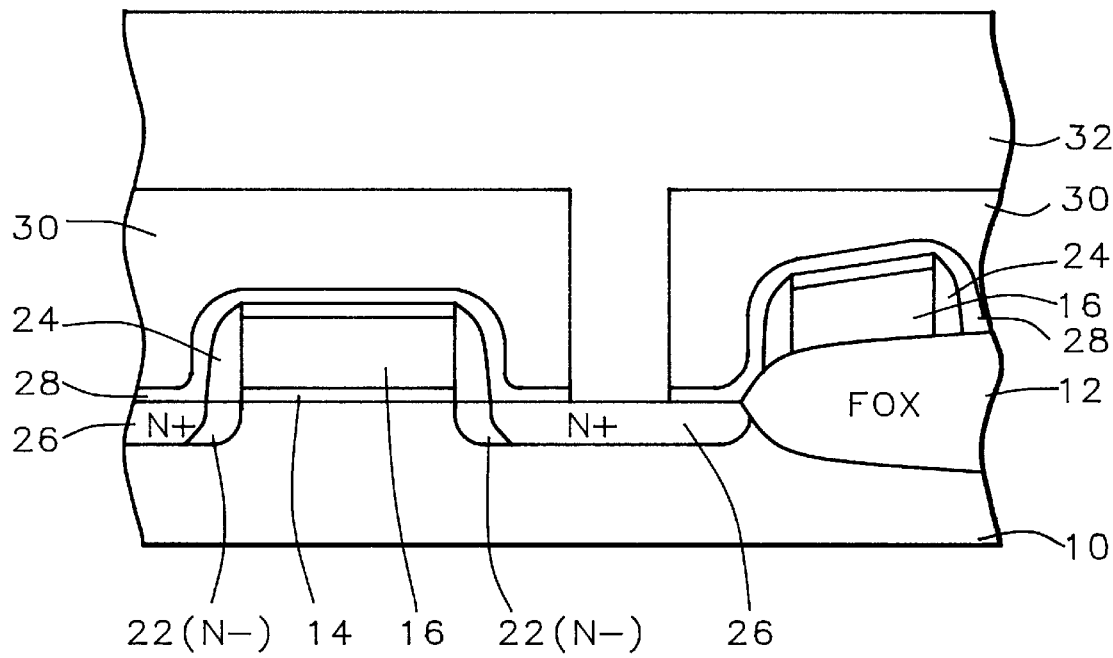

Referring now to FIG. 4, a first thick polysilicon layer 32 is deposited over CVD oxide or BPSG layer 30 by LPCVD either in situ doped or doped after deposition by ion implantation. The thickness of this layer is between about 2000 to 6000 Angstroms.

Figure 5:
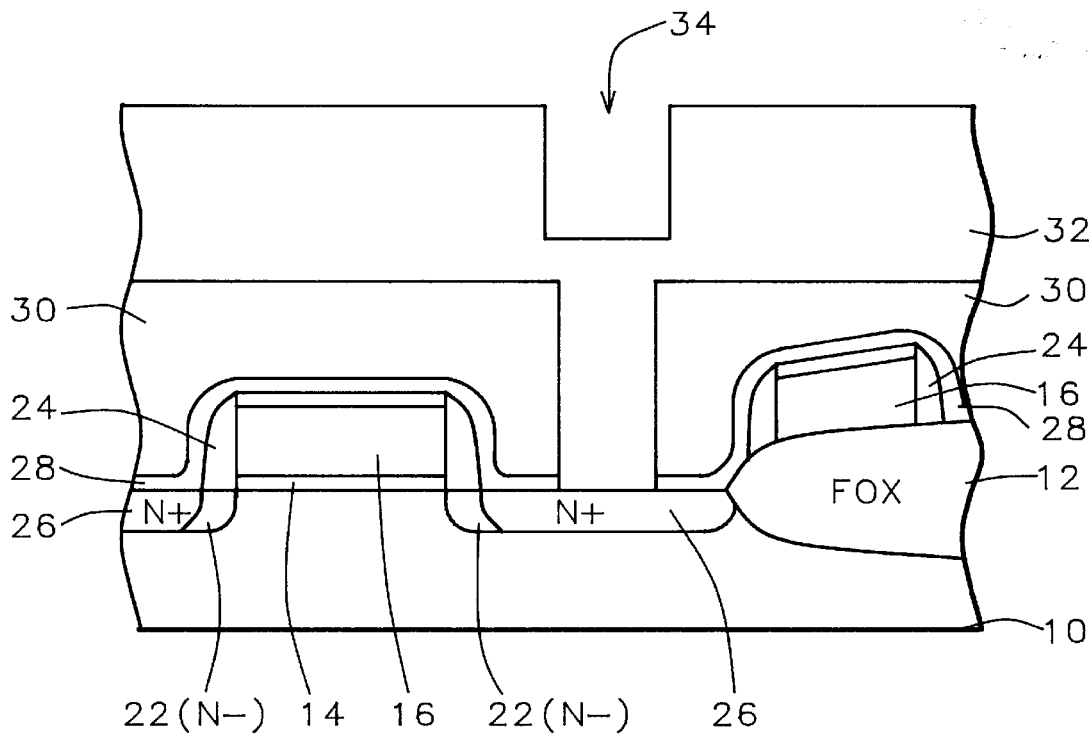

The thick polysilicon layer 32 is anisotropically etched into to form a well 34, as shown in FIG. 5. This may be a Magnetic Enhanced Reactive Ion Etching (MERIE). The width of the well 34 can be of the minimum dimension on the chip. The depth of the well 34 must be less than the thickness of layer 32.

Figure 6:
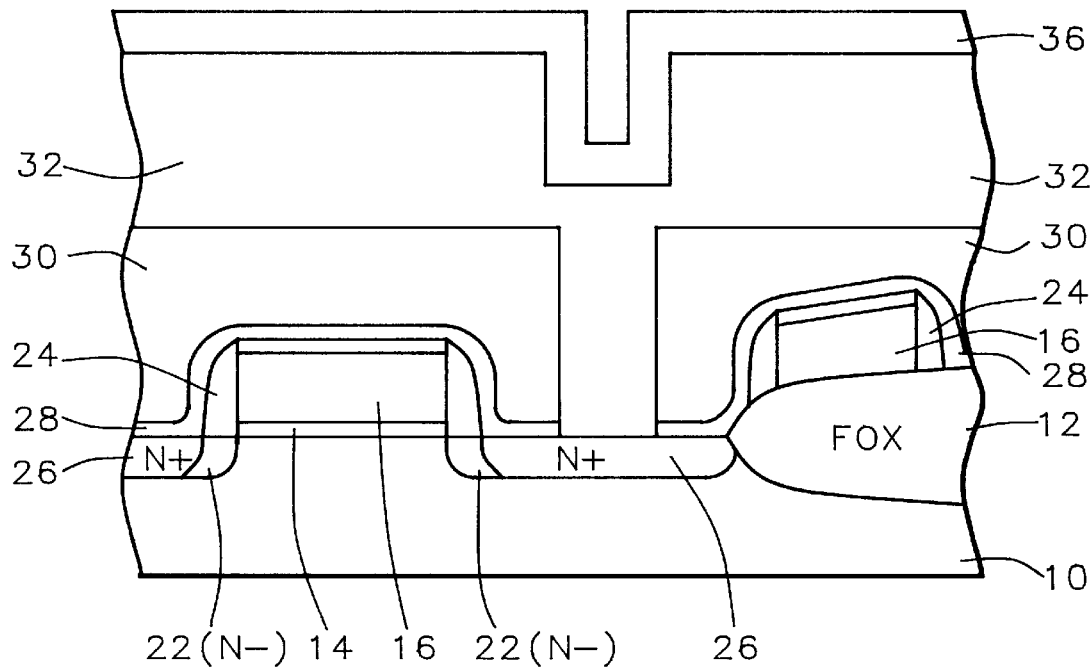

A layer of silicon oxide 36 is deposited over layer 32 and within the well 34 by CVD to a thickness of between about 2000 to 6000 Angstroms, as illustrated in FIG. 6.

Figure 7:
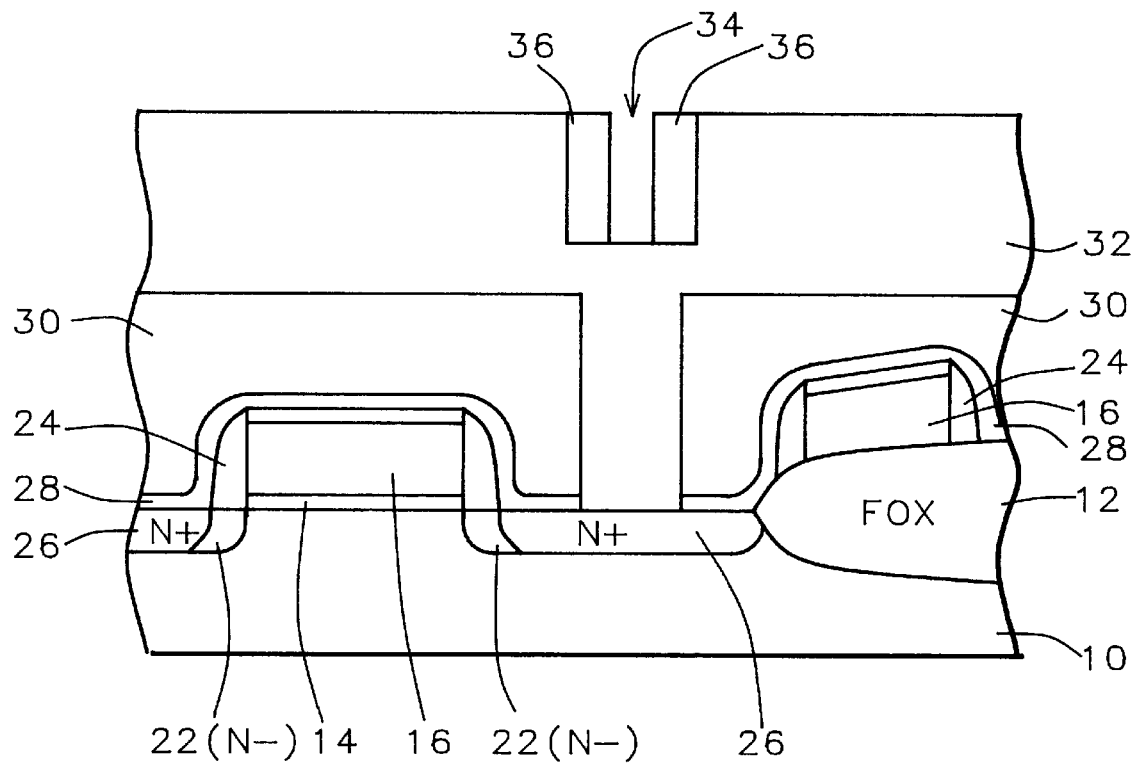

Referring now to FIG. 7, the silicon oxide layer 36 is etched back, using MERIE, to form spacers on the sidewalls of the well 34.

Figure 8:
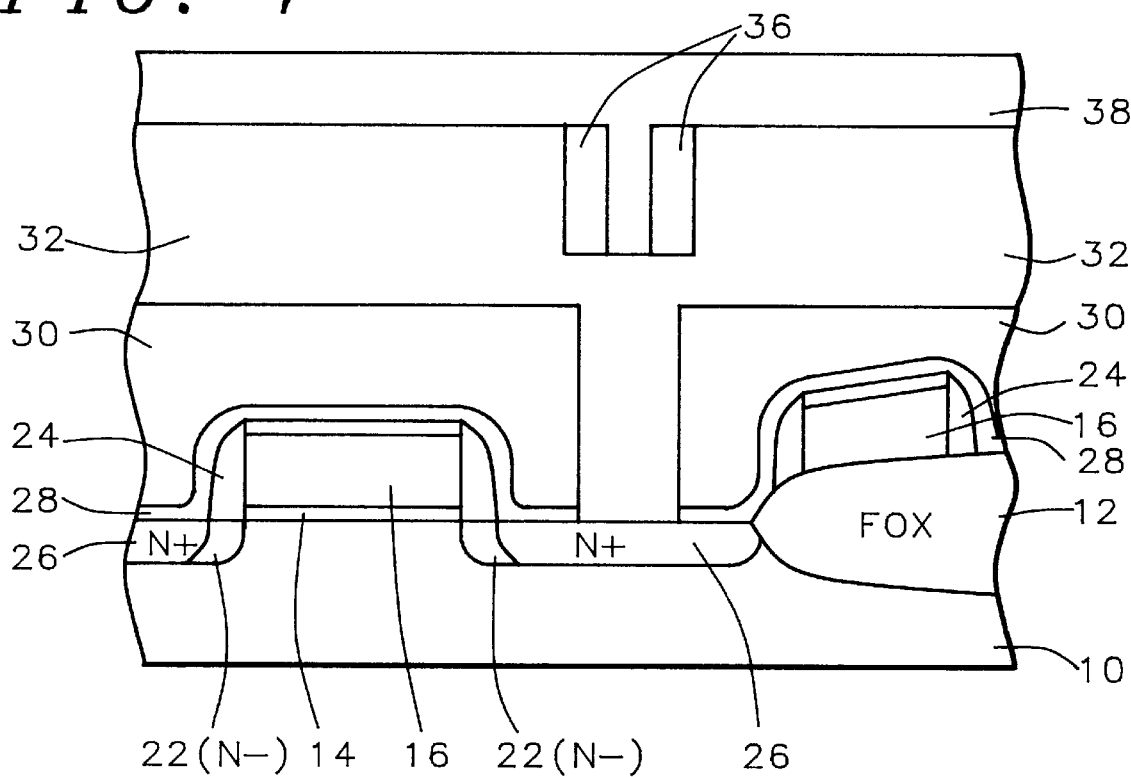

Referring now to FIG. 8, a second layer of polysilicon 38 is deposited over the first polysilicon layer 32, spacers 36, and within the well 34. The in-situ doped polysilicon layer 38 is deposited by LPCVD. This layer has a thickness of between about 500 to 1500 Angstroms.

Figure 9A:
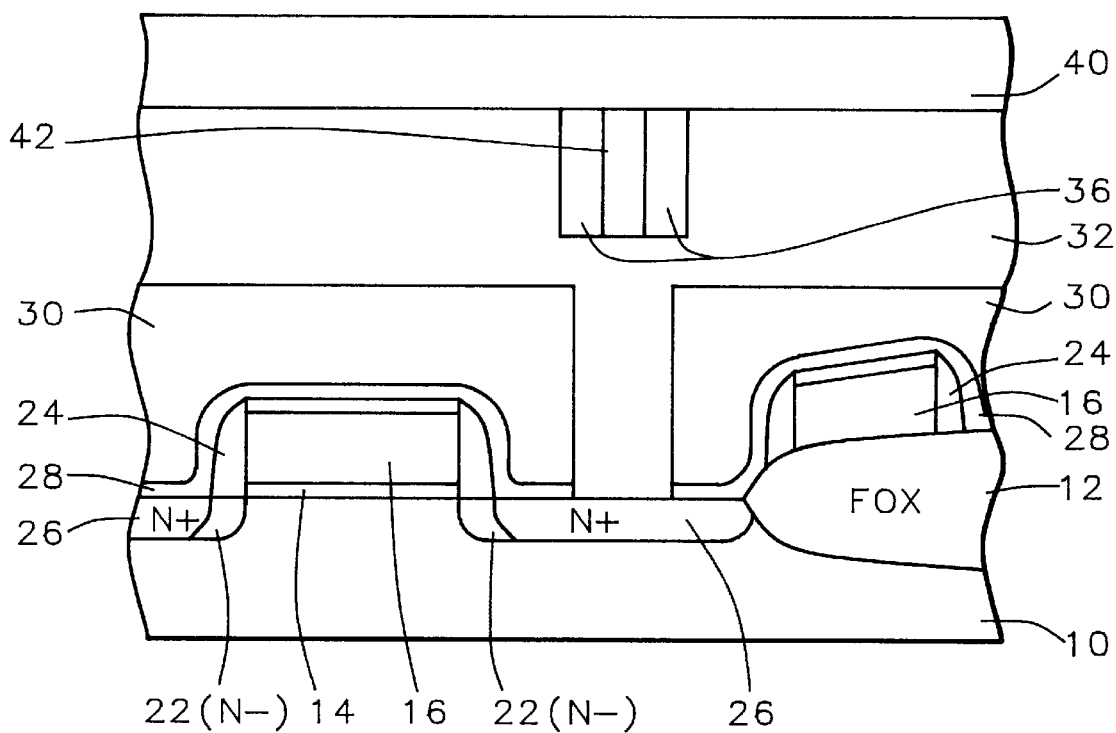
FIGS. 9A and 9B schematically illustrate in cross-sectional representation two alternative methods in the process of the present invention.

The polysilicon layer 38 is thermally oxidized to form polyoxide layer 40, shown in FIG. 9A.

Figure 10:
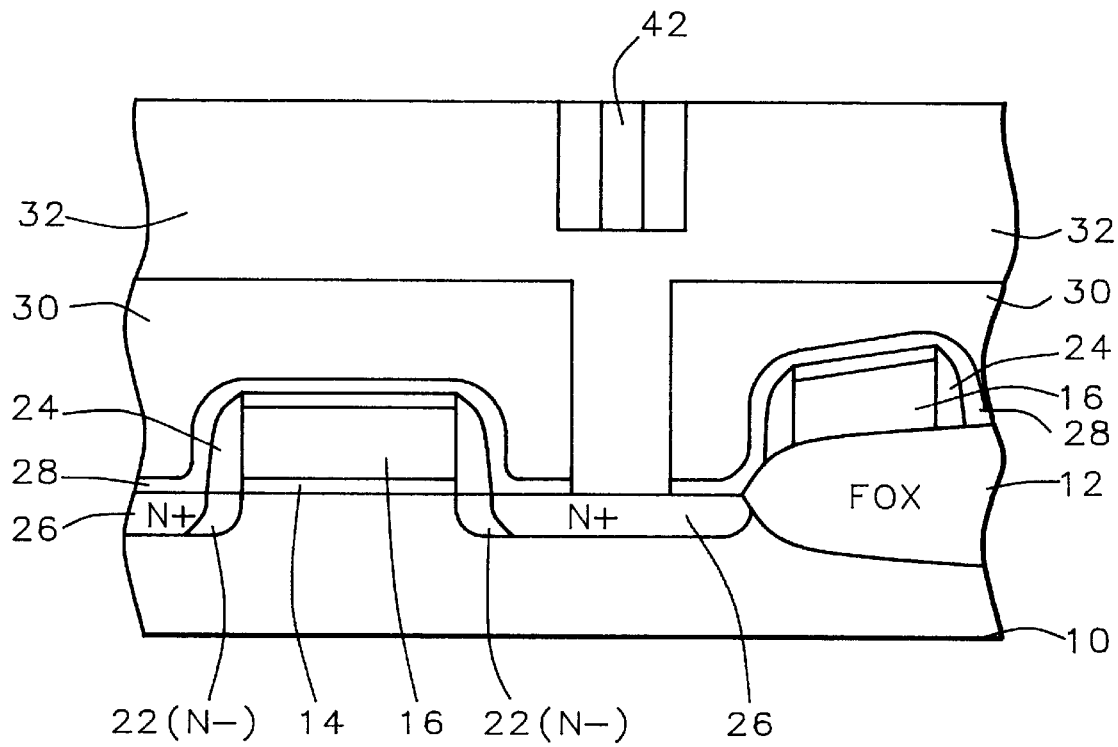

Referring now to FIG. 10, the polyoxide layer 40 and oxide spacers 36 are removed, using, for example, a hydrofluoric acid solution, to leave polysilicon plug 42.

Figure 9B:
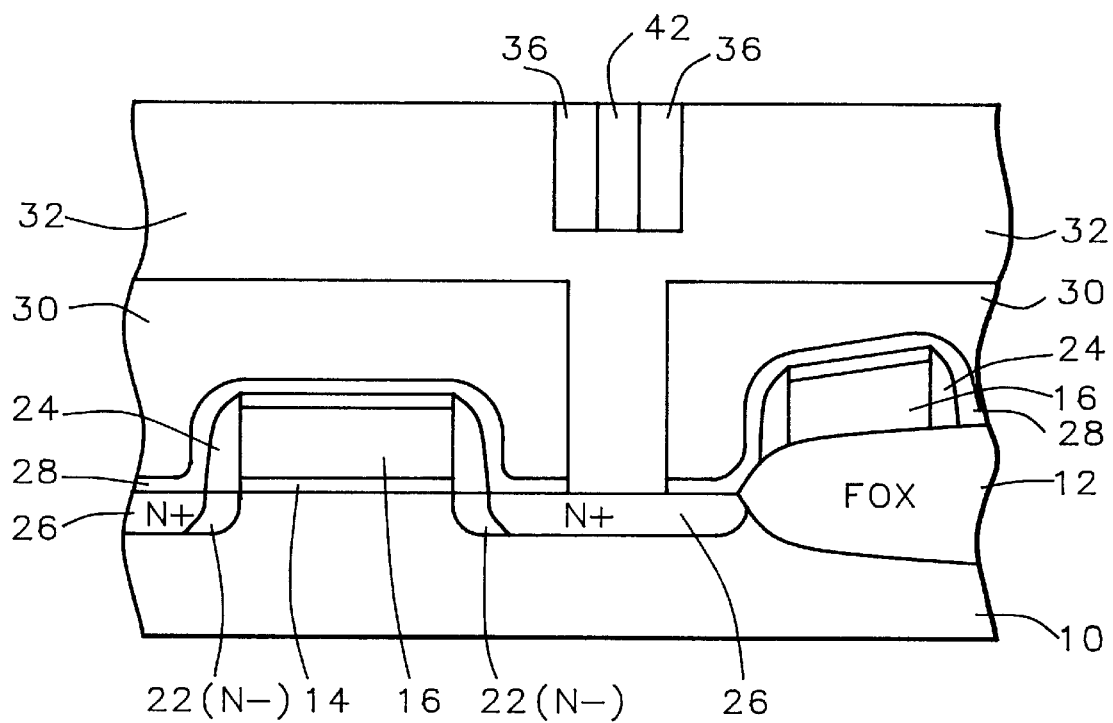

Alternatively, instead of oxidizing polysilicon layer 38, as shown in FIG. 9A, the polysilicon layer 38 can be etched back to leave the polysilicon plug 42, as shown in FIG. 9B. Then the oxide spacers 36 can be removed using, for example, a hydrofluoric acid solution, resulting also in FIG. 10.

Figure 11:
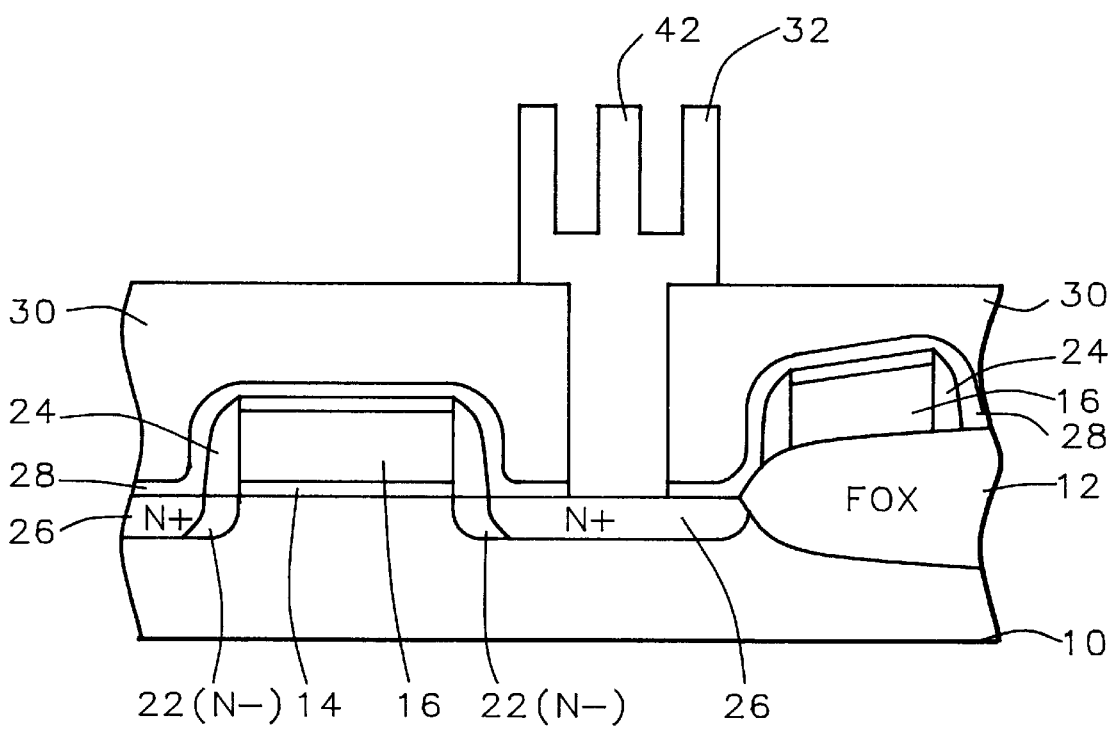

Referring now to FIG. 11, the polysilicon layer 32 is patterned to form the storage node of the capacitor. The portion of layer 32 contacting the node contact region forms the bottom electrode of the capacitor. Layer 32 and plug 42 together form the E-shaped storage node of the capacitor where the three prongs of the E-shape point upward.

Figure 12:
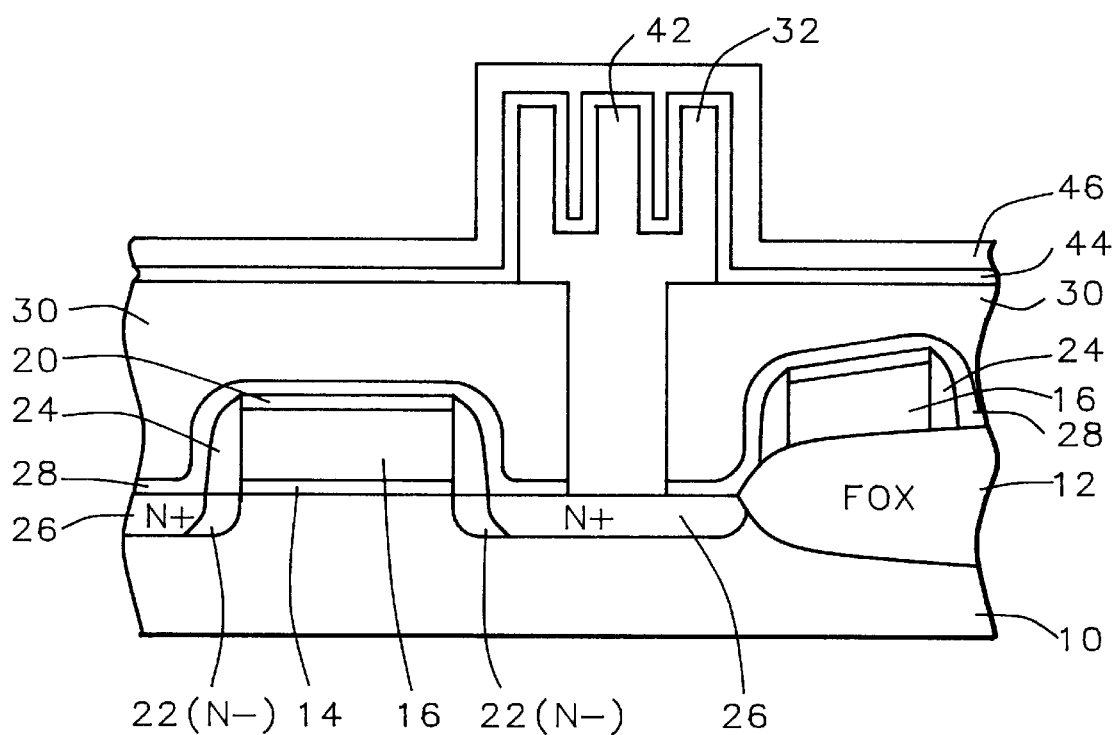

Referring now to FIG. 12, the capacitor dielectric layer 44 is now deposited conformally over the polysilicon 32 and 42 and insulating layer 30 surfaces. This layer is typically either composed of layers of silicon nitride and silicon oxide (NO) or layers of silicon oxide, silicon nitride and silicon oxide (ONO). In making the ONO dielectric, the first or bottom silicon oxide, O layer is usually a native oxide grown to a thickness of about 15 Angstroms. The silicon nitride, N layer is formed by LPCVD to give a resulting thickness of between about 80 to 200 Angstroms. The top silicon oxide, O layer may be formed in an oxidation furnace. The total ONO thickness is in the order of between about 100 to 250 Angstroms.

The top plate electrode is formed by depositing a third in-situ doped polysilicon layer 46 by LPCVD. The thickness of this layer 46 is between about 1000 to 2000 Angstroms.

The process of the invention results in an increased capacitance DRAM capacitor having an E-shaped storage node. Since the insulating layer 30 is planarized using CMP, the etchback to form the plug 42, which forms the middle prong of the E-shape, leaves no residue.

The DRAM integrated circuit with increased capacitance capacitor of the present invention is described with reference to FIG. 12. MOS devices, such as gate electrodes and word lines 20 lie on a semiconductor substrate 10. Source and drain regions 26 lie within the semiconductor substrate not covered by the MOS devices. A stacked capacitor 32 contacts one of the source and drain regions 26. The storage node of the capacitor comprises a cylindrical polysilicon structure 32 at the top of which is an E-shaped polysilicon structure 32,42 having the prongs of the E pointing upward. The capacitor dielectric 44 comprises NO or ONO covering all surfaces of the storage node 32 and 42. The top electrode 46 comprises polysilicon overlying the capacitor dielectric.

While the invention has been particularly shown and described with reference to the preferred embodiments thereof, it will be understood by those skilled in the art that various changes in form and details may be made without departing from the spirit and scope of the invention.

What is claimed is:

1. A dynamic random access memory having a high capacitance capacitor comprising:

field oxide areas on the surface of a semiconductor substrate which surround device areas comprising field effect devices, gate dielectric and gate electrode structures on said substrate in said device areas;

source/drain structures within said device areas of said semiconductor substrate associated with said gate electrode structures;

an insulating layer overlying said device areas; and said high capacitance capacitor structure including:

a bottom electrode formed solely by a central cylindrical portion of a polysilicon layer which electrically contacts said source/drain structures through an opening in said insulating layer;

a polysilicon storage node overlying said insulating layer and said central cylindrical portion of said polysilicon layer, said storage node having an E-shape with a base and three prongs wherein there is a central prong and two peripheral prongs wherein said base overlies said central cylindrical portion of said polysilicon layer and said insulating layer and wherein all of said prongs point upward from said insulating layer and wherein said central prong extends upward from said central cylindrical portion of said polysilicon layer;

a capacitor dielectric layer overlying all surfaces of said storage node; and a top plate electrode layer overlying said capacitor dielectric layer on all surfaces of said storage node to complete said capacitor.

2. The memory of claim 1 wherein said capacitor dielectric is composed of layers of silicon oxide, silicon nitride and silicon oxide having a combined thickness of between about 100 and 250 Angstroms.

3. The memory of claim 1 wherein said insulating layer comprises chemically vapor deposited oxide and has a thickness of between about 5000 to 10,000 Angstroms.

4. The memory of claim 1 wherein said insulating layer comprises borophosphosilicate glass and has a thickness of between about 5000 to 10,000 Angstroms.

5. The memory of claim 1 wherein said capacitor dielectric is composed of layers of silicon nitride and silicon oxide having a combined thickness of between about 100 and 250 Angstroms.

6. The memory of claim 1 wherein said top plate electrode layer comprises polysilicon.

* * * * *